(12) United States Patent
Miks et al.

(10) Patent No.: US 6,717,822 B1
(45) Date of Patent: Apr. 6, 2004

(54) LEAD-FRAME METHOD AND CIRCUIT MODULE ASSEMBLY INCLUDING EDGE STIFFENER

(75) Inventors: Jeffrey Alan Miks, Chandler, AZ (US); Markus Karl Liebhard, Oakland, CA (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 10/251,410

(22) Filed: Sep. 20, 2002

(51) Int. Cl.⁷ .................................................. H05K 1/18
(52) U.S. Cl. ....................... 361/764; 361/773; 361/718; 361/776; 361/774; 257/666; 257/670; 257/713
(58) Field of Search ................................. 361/764, 772, 361/773, 718, 774, 776, 813; 257/666, 670, 713; 174/261, 776, 52.2; 438/123, 111

(56) References Cited

U.S. PATENT DOCUMENTS

| | | | |
|---|---|---|---|
| 4,532,419 A | | 7/1985 | Takeda |
| 4,905,124 A | | 2/1990 | Banjo et al. |
| 4,965,654 A | * | 10/1990 | Karner et al. ............. 257/676 |
| 4,974,120 A | | 11/1990 | Kodai et al. |
| 5,574,309 A | | 11/1996 | Papapietro et al. |
| 5,742,479 A | | 4/1998 | Asakura |
| 5,784,259 A | | 7/1998 | Asakura |
| 5,792,676 A | * | 8/1998 | Masumoto et al. ........... 438/11 |
| 5,822,190 A | | 10/1998 | Iwasaki |
| 6,040,622 A | | 3/2000 | Wallace |
| D445,096 S | | 7/2001 | Wallace |
| D446,525 S | | 8/2001 | Okamoto et al. |
| 6,414,396 B1 | * | 7/2002 | Shim et al. ................. 257/778 |
| 6,603,196 B2 | | 8/2003 | Lee et al. |

FOREIGN PATENT DOCUMENTS

| | | |
|---|---|---|
| JP | 3-112688 | 5/1991 |
| JP | 07017175 A | 1/1995 |
| JP | 08190615 A | 7/1996 |
| JP | 10-12646 | 1/1998 |
| JP | 10-334205 | 12/1998 |
| JP | 11-45959 | 2/1999 |

\* cited by examiner

Primary Examiner—David Martin
Assistant Examiner—Hung Bui
(74) Attorney, Agent, or Firm—Weiss, Moy & Harris, P.C.

(57) ABSTRACT

An edge stiffener added to a lead-frame based circuit module provides protection of the peripheral flange of the circuit module during handling and manufacturing processes. The edge stiffener may be coupled to leads of the lead-frame for providing electrical contacts at the periphery of the circuit module or may be form widened portions of a tie bar that is connected to the lead frame by leads extending through gaps between the ends of the edge stiffener portions. Singulation of the circuit module will result in edge stiffener portions that are not coupled to the lead frame, but are secured within the encapsulant.

17 Claims, 4 Drawing Sheets

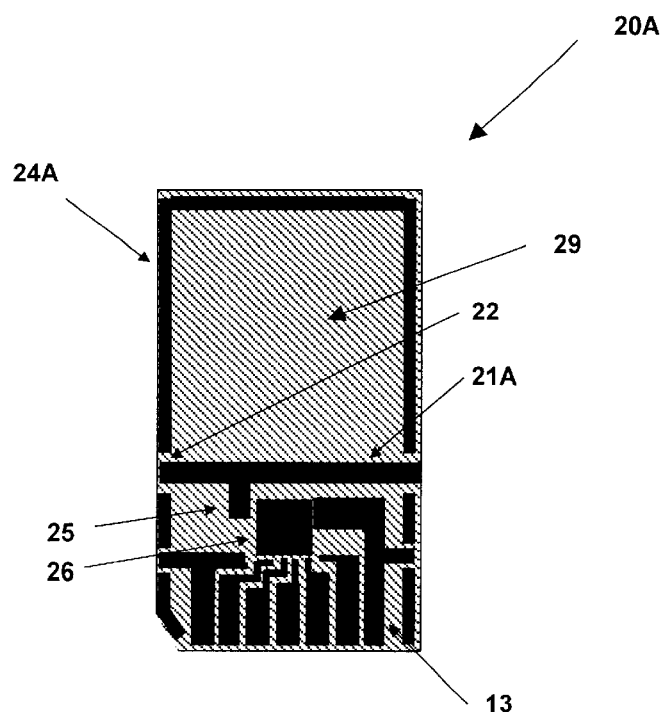
Fig. 3A
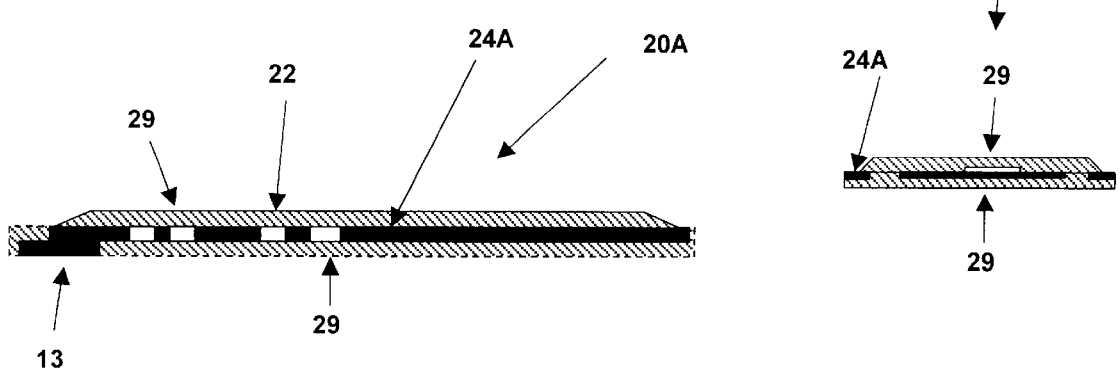
Fig. 3B
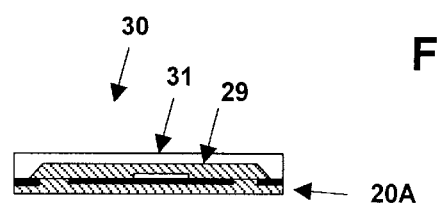
Fig. 3C
Fig. 3D

LEAD-FRAME METHOD AND CIRCUIT MODULE ASSEMBLY INCLUDING EDGE STIFFENER

CROSS-REFERENCE TO RELATED APPLICATIONS

The present application is related to previously-filed U.S. Patent Application: "LEAD-FRAME METHOD AND ASSEMBLY FOR INTERCONNECTING CIRCUITS WITHIN A CIRCUIT MODULE" Ser. No. 09/956,190 filed Sep. 19, 2001, having at least one common inventor and assigned to the same assignee. The specification of the above-referenced patent application is incorporated herein by reference.

FIELD OF THE INVENTION

The present invention relates generally to circuit modules, and more specifically, to a lead-frame interconnect circuit module method and assembly.

BACKGROUND OF THE INVENTION

Circuit modules or cards are increasing in use to provide storage and other electronic functions for devices such as digital cameras, personal computing devices and personal digital assistants (PDAs). New uses for circuit modules include multimedia cards and secure digital cards.

The above-incorporated patent application describes a circuit module assembly and method of manufacture therefor that provides a lead-frame as an alternative to a printed circuit substrate for fabricating a circuit module. The circuit module includes a lead-frame encapsulated within an encapsulant. The edges of the circuit module assembly are plastic and are much thinner than the central portion, making them subject to damage during handling, placement and other steps in the manufacturing process.

Therefore, it would be desirable to provide a lead-frame method and assembly for interconnecting circuits within modules that require no circuit board substrate that incorporates protection at the edges of the circuit module assembly.

SUMMARY OF THE INVENTION

A circuit module assembly and method for interconnecting circuits within modules provides a circuit module that may be fabricated without a circuit board substrate. An edge stiffener that may be fabricated as part of the lead-frame is incorporated with the circuit module to provide protection against damage. The lead-frame is connected to one or more dies within the circuit module assembly and external contacts may be provided by an extension of the lead-frame assembly out of the plane of the die interconnect.

BRIEF DESCRIPTION OF THE DRAWINGS

FIG. 3A is a pictorial diagram depicting a top view, FIG. 3B is a pictorial diagram depicting a side cross section, FIG. 3C is an end cross section of a circuit module in accordance with an embodiment of the invention, and FIG. 3D is a pictorial diagram depicting a circuit module incorporating a cover.

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
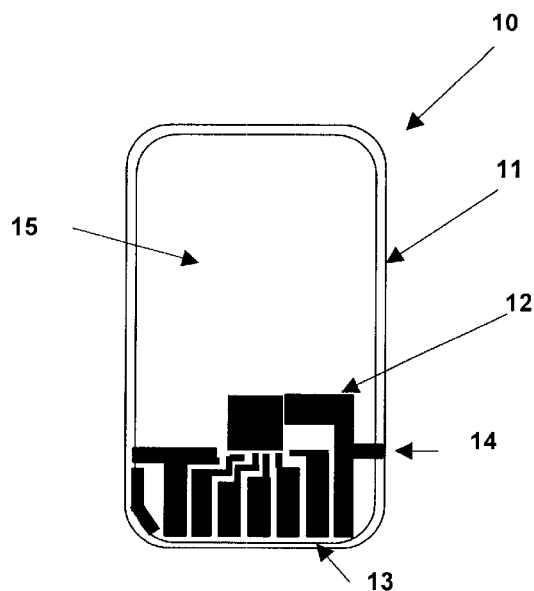
FIG. 1A is a pictorial diagram depicting a top view.
Figure 1B:
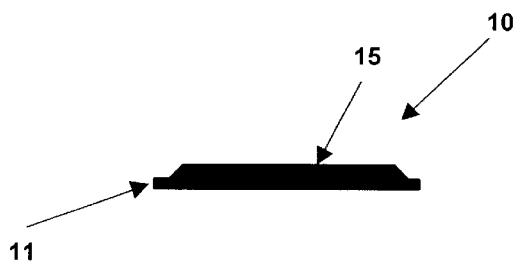
FIG. 1B is a pictorial diagram depicting a cross section of a circuit module incorporating a lead-frame.

Referring now to the figures and in particular to FIGS. 1A and 1B a top view and a cross section of a circuit module 10 as described in the above-incorporated patent application are depicted. Circuit module 10 is depicted as a circuit module as used in various multimedia card memory applications.

Figure 1C:
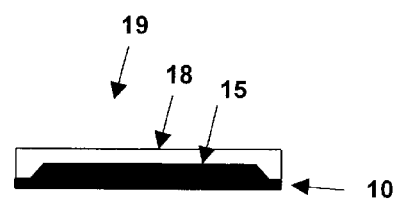
FIG. 1C is a pictorial diagram depicting a circuit module incorporating a cover.

A lead frame 12 to which integrated circuit dies are attached and circuit contacts 13 are included on the bottom side, is covered by an encapsulation 15 that is deposited around lead frame 12 and any included circuit components. The circuit module housing may be completely formed from an encapsulant, or the circuit may be encapsulated as shown and a lid 18 applied over encapsulant 15 as shown in FIG. 1C forming a packaged circuit module 19. Integrated circuit dies and other components are coupled to each other and to circuit contacts 13 by circuit traces forming part of lead frame 12.

An edge 11 is formed at the edge of encapsulant to permit attachment of a cover or to meet form-factor requirements for applications that typically are implemented by including a substrate on the bottom of the circuit module. While the use of a lead frame as described in the above incorporated patent application provides a lower cost and potentially more reliable alternative to substrate-based designs. The edge formed at the periphery of circuit module 10 is subject to chipping or other breakage, as encapsulant 15 is typically a plastic or epoxy material that can be broken during pick-and-place, handling or other manufacturing operations. The structure of circuit module 10 at the edge 11 of encapsulant 15 is limited by the manufacturing process of the lead frame, as prior to singulation of circuit module 10, the lead frame tie-bars structure is present around the edge 11 of circuit module 10.

Prior to singulation of circuit module 10, the tie-bar structure (generally a frame around the entire lead frame carrier) holds the conductors in the lead frame in physical relationship to each other, securing their positions prior to the sawing or punching of the tie-bar structure away from the leads in the lead frame. Since the leads in the lead frame (or extensions of the leads) extend to the tie-bar structure, some of the leads or extensions 14 are present at the edge 11 of circuit module 10 and must be isolated electrically from each other. Generally the leads must also be insulated from the exterior of the package unless they are used as electrical connectors.

Figure 2A:
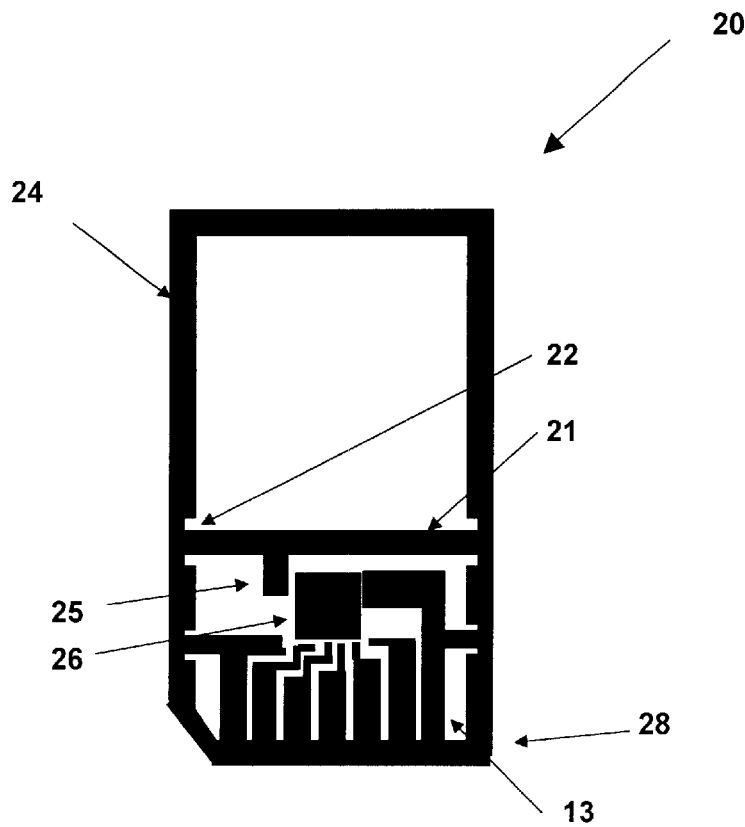
FIG. 2A is a pictorial diagram depicting a top view and FIG. 2B is a pictorial diagram depicting a cross section of lead-frame incorporating edge protection for use within a circuit module in accordance with an embodiment of the invention.

The present invention provides a circuit module that includes an edge support to prevent the chipping or breakage problem. Referring now to FIG. 2A, a top view of a lead-frame 20 in accordance with an embodiment of the invention is depicted. Circuit contacts 13, die mount 26 (may be more than one die mount) and leads 21 are supported by a tie-bar 24 that surrounds the periphery of lead-frame 20, providing rigidity during the fabrication and integration processes. Lead-frame 20 is generally stamped from a metal, such as copper, and an integrated circuit die is bonded to lead-frame in die bonding area 26. The mounted die is wire bonded or otherwise electrically connected to leads of lead frame 10. The lead-frame is then encapsulated and portions of tie-bar 24 are cut, resulting in electrical isolation of the leads within lead frame 20, after mechanical rigidity has been provided by the encapsulant.

Lead frame 20 incorporates an edge stiffener within a circuit module by extending the tie-bar toward the interior of lead-frame 20. After singulation, segments of tie-bar 24 will remain within the circuit module, providing support at the edges of the encapsulant. Leads 21 within lead frame are isolated by gaps 22 in the edge stiffener. When the circuit module is singulated, tie-bar 24 is cut or punched on a line passing through gaps 22 so that lead 21 are isolated from the remainder of tie-bar.

Figure 2B:
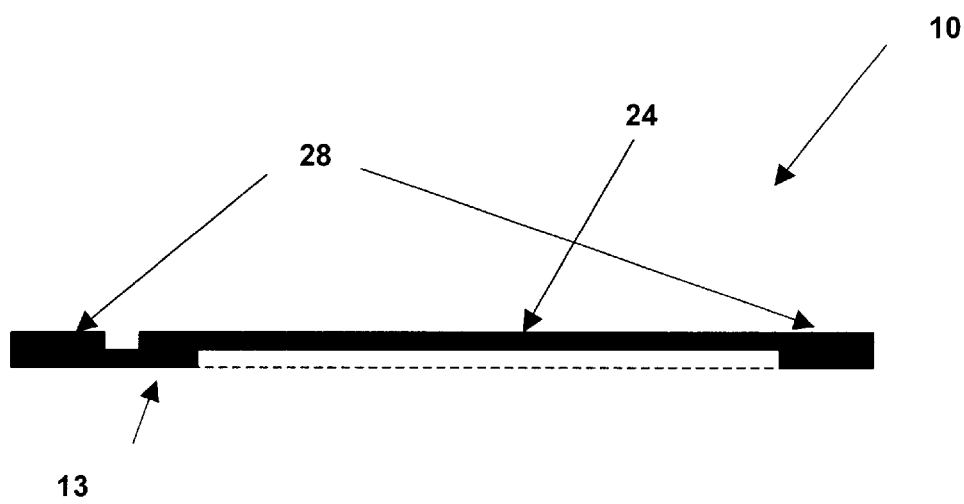

Referring now to FIG. 2B, a cross-section side view of lead-frame 20 is depicted. An outer portion 28 of tie-bar 24 is shown at ends of the lead-frame and is cut-away along the sides in the figure to illustrate that the lead frame leads and edge stiffener segments may be made using a half-thickness of metal with respect to the outer portion 28 of tie-bar 24. This half-thickness may be produced by etching the bottom side of lead-frame after applying an etchant resistant coating to tie-bar end 28 and circuit contacts 13. Circuit contacts 13 are also partially a half-thickness of metal, produced by etching the top side of lead-frame after applying an etchant resistive coating to the lead frame leads and tie-bar 24. The etching of both sides of lead-frame 20 results in a circuit that has circuit contacts 13 disposed as an extension below the plane of the leads and edge-stiffener segments, while the full thickness portion of the electrical contacts/circuit trace combination produces a continuous conductive and mechanically rigid connection from the lead frame leads to circuit contacts 13. Thus, encapsulant may be applied beneath the leads and edge-stiffener segments and the circuit contact 13 surfaces may protrude from the encapsulant, providing an interface connection external to a circuit module.

As an alternative, circuit contacts 13 may be fabricated in the same plane as the lead frame leads and additional length supplied so that the leads may be bent to provide an extension out of the plane of the leads so that circuit contacts 13 may protrude from an encapsulant applied beneath lead-frame 20.

Referring now to FIG. 3A, a top view of a circuit module 20A in accordance with an embodiment of the present invention is depicted. Circuit module 20A is depicted as a circuit module as used in various multimedia card memory applications. The present invention is also applicable to cards and modules having other outlines such as secure digital cards and to peripheral device cards (I/O cards), as well.

The illustrative embodiments herein depict an etched lead-frame, but lead-frames may also be stamped in accordance with an embodiment of the present invention. The depiction shows the internal features after an encapsulant 29 cover has been applied and the tie-bar 24 of FIGS. 2A–2B is singulated from circuit module 20A, leaving edge stiffener segments 24A. The resulting circuit module 20A has leads are isolated (but supported by encapsulant 29). Leads 21A that were previously contiguous to tie-bar are now isolated electrically by gaps 22. Leads 21A may be used to provide peripheral contacts and may have connection points 25 to internal circuits (such as wire bond pads for bonding wires from a die). The edge stiffener segments may also be used. In particular, due to their large area, they may be used to provide ground and/or power supply connections to circuit module 20A. Circuit contacts 13 are located at the bottom surface of encapsulant 29 and protrude from or are conformal to the bottom surface to provide an external electrical connection.

Referring now to FIG. 3B, a cross-section side view of circuit module 20A is depicted. The plane of the leads in lead frame adjacent to the plane of electrical contacts 13 may be seen from the figure. Gaps 22 are shown to illustrate their relative position, although they will generally be filled with encapsulant 29. Encapsulant 29 surrounds the remaining lead frame elements, except for the bottom surface of contacts 13.

Referring now to FIG. 3C, a cross-section end view of circuit module 20A is depicted. Edge stiffener segments 24A can be seen disposed at the top side of the edges of circuit module 20A, where they provide protection from chipping or breakage. In the illustrated embodiment, only the bottom and one side surface of edge stiffener segments 24A are embedded in encapsulant 29, but other variants may be fabricated. The depicted embodiment is useful for providing one or more electrical contacts at the top edges of the circuit module 20A, and may provide contact to a metallic cover or provide a visually distinctive appearance to a module without a cover. The extensions of leads in the lead frame that extended to the tie bar are also accessible at the top side of circuit module 20A and may provide electrical contacts or further add to the visual distinctiveness provided by the edge stiffener segments.

Referring now to FIG. 3D, a cover 31 may be applied over encapsulant 29 of circuit module 20A, providing a package 30 with a rectangular (or other suitable or specified) cross-section.

Figure 4A:
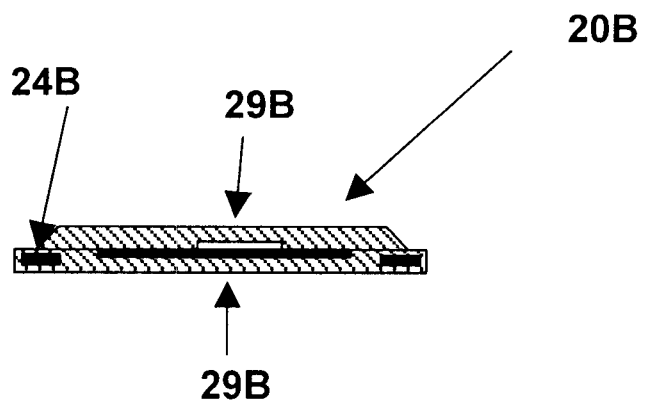
FIGS. 4A and 4B are pictorial diagrams depicting cross sections of circuit modules in accordance with alternative embodiments of the invention.

Referring now to FIG. 4A, a cross-sectional end view of a circuit module 20B in accordance with an alternative embodiment of the invention is depicted. Circuit module 20B includes edge stiffener segments enclosed within encapsulant 29B. The depicted embodiment is especially suited for applications wherein the edge stiffener segments (and also any extensions of leads in the lead frame that extended to the tie-bar) need to be insulated from the exterior of the package or visually hidden. Circuit module 20B can be made from a lead frame that includes the edge stiffener segments co-planar with the leads and wherein the lead plane is set beneath the top of edges of encapsulant 29B. Alternatively, the top of the edge stiffener segments may be etched so that the top plane of the edge stiffener segments is below the plane of the leads.

Figure 4B:
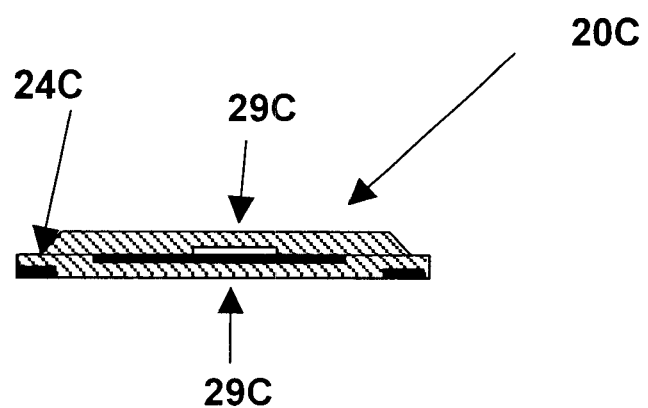

Referring now to FIG. 4B, a cross-sectional end view of a circuit module 20C in accordance with an another alternative embodiment of the invention is depicted. Circuit module 20C includes edge stiffener segments exposed at the bottom surface of encapsulant 29C. The depicted embodiment is especially suited for applications wherein the edge stiffener segments (and also any extensions of leads in the lead frame that extended to the tie-bar) are provided as external circuit contacts at the same plane as contacts 13, or where the edge stiffener segments and any extensions of the lead frame provide visual distinctiveness at the bottom of the card. It should be noted that at present contact 13 designs utilize variation in layout amongst manufacturers in such applications as Secure Digital Card memory to provide visual distinctiveness.

Circuit module 20C can be made from a lead frame that includes the edge stiffener segments co-planar with contacts 13 and may be etched in a manner similar to that described for the etching of contacts 13 described above.

The above description of embodiments of the invention is intended to be illustrative and not limiting. Other embodiments of this invention will be obvious to those skilled in the art in view of the above disclosure and fall within the scope of the present invention.

What is claimed is:

1. A circuit module, comprising:
   at least one integrated circuit for providing an electronic function of the circuit module;
   a lead-frame for mounting and providing electrical connection to the at least one integrated circuit within the circuit module;
   an encapsulation containing the at least one integrated circuit and the lead-frame on both a, top and a bottom side, wherein the encapsulation includes a central portion and a flange disposed at the edges of the encapsulation, and wherein the flange is substantially thinner than the central portion of the encapsulation;
   an edge stiffener disposed at least within the flange of the encapsulation, whereby edges of the circuit module are protected from physical damage; and
   a plurality of external contacts electrically coupled to the lead-frame and exposed at a surface of the encapsulation for providing an electrical interface to the at least one integrated circuit.

2. The circuit module of claim 1, wherein the edge stiffener is a metal strip disposed around the periphery of the flange of the encapsulation.

3. The circuit module of claim 2, wherein the edge stiffener is discontinuous, including stiffener portions not connected to the lead frame and remnant portions connected to leads within the lead frame, whereby the stiffener portions are supported by a tie bar connected to the remnant portions prior to singulation of the circuit module.

4. The circuit module of claim 3, wherein at least one of the remnant portions is exposed at a surface of the encapsulant for providing an electrical connection to a lead within the lead frame connected to the at least one remnant portion.

5. The circuit module of claim 2, wherein a top face of the edge stiffener is covered by the encapsulation and a bottom face of the edge stiffener is exposed at the bottom of the circuit module and is flush with the bottom of the encapsulation.

6. The circuit module of claim 2, wherein the edge stiffener is electrically connected to leads of the lead frame, whereby exposed portions of the edge stiffener provide an electrical connection at an edge of the circuit module.

7. The circuit module of claim 6, wherein the edge stiffener comprises multiple metal segments, whereby exposed portions of the multiple segments provide at least one electrical connection at the edge of the circuit module.

8. The circuit module of claim 2, wherein a bottom face of the edge stiffener is covered by the encapsulation and a top face of the edge stiffener forms the top of the flange.

9. The circuit module of claim 2, wherein the edge stiffener forms the flange and extends within the encapsulation, whereby the edge stiffener is secured to the circuit module.

10. A circuit module, comprising:
    at least one integrated circuit for providing an electronic function of the circuit module;
    means for mounting and electrically interconnecting the at least one integrated circuit;
    an encapsulation containing the at least one integrated circuit and the mounting means; and
    means for stiffening edges of the encapsulation to prevent physical damage.

11. A circuit module, comprising:
    at least one integrated circuit for providing an electronic function of the circuit module;
    a lead-frame for interconnecting at least one integrated circuit within the circuit module, the lead-frame comprising a contiguous conductive assembly and including an edge stiffener secured to the lead-frame at the periphery of the lead-frame with at least one tie bar;
    an encapsulation at least partially enclosing the edge stiffener, whereby the encapsulation is stiffened; and
    a plurality of external contacts disposed along a bottom surface of the circuit module for providing an electrical interface to the integrated circuit.

12. The circuit module of claim 11, further comprising an encapsulation containing the at least one integrated circuit and the lead-frame.

13. The circuit module of claim 12, wherein the encapsulation containing the at least one integrated circuit and the lead-frame on both a top and bottom side, wherein the encapsulation includes a central portion and a flange disposed at edges of the encapsulation, and wherein the flange is substantially thinner than the central portion of the encapsulation.

14. The circuit module of claim 11, wherein the edge stiffener comprises sections of the at least one tie bar extending inward from the periphery of the lead frame and wherein the tie bar is secured to the lead-frame by leads connected to the at least one tie bar between ends of the edge stiffener sections, whereby cutting the edge sections from the tie bar will disconnect the edge stiffener sections from the lead-frame.

15. The circuit module of claim 11, wherein the edge stiffener is electrically coupled to the lead-frame by at least one lead within the lead-frame.

16. The circuit module of claim 11, further comprising an extension extending from the plane of a the lead-frame to form the edge stiffener in a plane substantially parallel to the lead-frame carrier and displaced from a plane of the lead-frame carrier, so-that an encapsulant may be applied to cover the plane of the lead-frame carrier without covering the bottom of the edge-stiffener.

17. The circuit module of claim 11, wherein the edge stiffener is contiguous with a lead-frame carrier, is located in a parallel plane adjacent to the plane of the lead-frame carrier, and wherein the mechanical connection between the lead-frame carrier and the edge stiffener is provided by a region of metal thicker than the portion of the lead-frame carrier connecting to the at least one integrated circuit.

* * * * *